(12) United States Patent
Kasai (10) Patent No.: US 9,088,128 B2
(45) Date of Patent: Jul. 21, 2015

(54) LASER MODULE AND METHOD FOR MANUFACTURING SAME

(71) Applicant: FUJIKURA LTD., Tokyo (JP)

(72) Inventor: Yohei Kasai, Sakura (JP)

(73) Assignee: FUJIKURA LTD., Tokyo (JP)

( * ) Notice: Subject to any disclaimer, the term of this patent is extended or adjusted under 35 U.S.C. 154(b) by 0 days.

(21) Appl. No.: 14/296,799

(22) Filed: Jun. 5, 2014

(65) Prior Publication Data

US 2014/0286363 A1     Sep. 25, 2014

Related U.S. Application Data

(63) Continuation of application No. PCT/JP2012/069194, filed on Jul. 27, 2012.

(30) Foreign Application Priority Data

Dec. 26, 2011   (JP) ................................. 2011-282899

(51) Int. Cl.
*H01S 3/30* (2006.01)
*H01S 3/067* (2006.01)
*G02B 6/42* (2006.01)
(Continued)

(52) U.S. Cl.
CPC ........... *H01S 3/06704* (2013.01); *B23K 1/0008* (2013.01); *G02B 6/4204* (2013.01); *G02B 6/4268* (2013.01); *H01S 5/02284* (2013.01); G02B 6/4248 (2013.01); H01L 2224/48091 (2013.01); H01L 2224/48247 (2013.01); H01S 5/005 (2013.01); H01S 5/02248 (2013.01); H01S 5/02252 (2013.01)

(58) Field of Classification Search
CPC ............................... H01S 3/02; H01S 3/06704
USPC ......... 372/6; 361/730, 752, 800, 815; 385/88, 385/89
See application file for complete search history.

(56) References Cited

U.S. PATENT DOCUMENTS 5,068,865 A * 11/1991 Ohshima et al. ................ 372/36
5,132,532 A *  7/1992 Watanabe ...................... 250/239
(Continued)

FOREIGN PATENT DOCUMENTS

JP       08-122578 A     5/1996
JP     2001-194561 A     7/2001
(Continued)

OTHER PUBLICATIONS

International Search Report, dated Oct. 9, 2012, issued in corresponding application No. PCT/JP2012/069194.

*Primary Examiner* — Tod T Van Roy
*Assistant Examiner* — Vu A Vu
(74) *Attorney, Agent, or Firm* — Westerman, Hattori, Daniels & Adrian, LLP (57) ABSTRACT

A laser module includes: a bottom plate of a box; the frame member being fixed to the bottom plate; a pipe member including a hollow portion PH communicating with the through hole OP of a box, the pipe member being fixed to the outer wall of the frame member; an optical fiber held on the hollow portion PH of the pipe member; and a laser element accommodated in the internal space of the box, the optical axis of the laser element being aligned with the optical axis of the optical fiber. When the bottom plate is placed on a plane, the bottom face of the pipe member is on the same face as a bottom plate portion contacting the plane.

6 Claims, 5 Drawing Sheets

(51) Int. Cl.
*B23K 1/00* (2006.01)
*H01S 5/00* (2006.01)
*H01S 5/022* (2006.01)

(56) References Cited

U.S. PATENT DOCUMENTS

| | | | | |
|---|---|---|---|---|
| 5,195,155 | A * | 3/1993 | Shimaoka et al. | 385/90 |
| 5,275,328 | A * | 1/1994 | Lodge et al. | 228/118 |
| 5,291,571 | A * | 3/1994 | Kunikane et al. | 385/93 |
| 5,408,559 | A * | 4/1995 | Takahashi et al. | 385/89 |
| 5,430,820 | A * | 7/1995 | van Tongeren et al. | 385/94 |
| 5,613,026 | A * | 3/1997 | Nagata et al. | 385/94 |
| 5,675,685 | A * | 10/1997 | Fukuda et al. | 385/89 |
| 5,784,513 | A * | 7/1998 | Kuribayashi et al. | 385/88 |
| 6,086,265 | A * | 7/2000 | Kuribayashi et al. | 385/92 |
| 6,244,754 | B1 * | 6/2001 | Takagi et al. | 385/88 |
| 6,371,664 | B2 * | 4/2002 | Takahashi et al. | 385/89 |
| 6,394,665 | B1 * | 5/2002 | Hayashi | 385/88 |
| 6,422,766 | B1 * | 7/2002 | Althaus et al. | 385/94 |
| 6,522,486 | B2 * | 2/2003 | Furuhashi et al. | 359/819 |
| 6,697,399 | B2 * | 2/2004 | Kimura et al. | 372/36 |
| 6,720,582 | B2 * | 4/2004 | Miyokawa et al. | 257/98 |
| 6,721,511 | B1 * | 4/2004 | Tatsuno et al. | 398/141 |
| 6,773,171 | B2 * | 8/2004 | Lake | 385/92 |
| 6,786,627 | B2 * | 9/2004 | Takagi et al. | 362/555 |
| 6,796,725 | B2 * | 9/2004 | Velsher et al. | 385/92 |
| 6,821,030 | B2 * | 11/2004 | Fukuda et al. | 385/92 |
| 6,917,482 | B2 * | 7/2005 | Minamino et al. | 359/819 |
| 7,052,189 | B2 * | 5/2006 | Naka et al. | 385/92 |
| 7,226,218 | B2 * | 6/2007 | Wang et al. | 385/91 |
| 7,254,298 | B2 * | 8/2007 | Hatori | 385/43 |
| 7,267,492 | B2 * | 9/2007 | Ikeda et al. | 385/88 |
| 7,296,939 | B2 * | 11/2007 | Sonoda et al. | 385/94 |
| 7,304,293 | B2 * | 12/2007 | Nagano | 250/227.11 |
| 7,367,716 | B2 * | 5/2008 | Nagano et al. | 385/89 |
| 7,477,810 | B2 * | 1/2009 | Miyokawa et al. | 385/14 |
| 2002/0154872 | A1 * | 10/2002 | Miyokawa | 385/92 |
| 2006/0159405 | A1 * | 7/2006 | Yajima | 385/88 |
| 2006/0215967 | A1 | 9/2006 | Nagano et al. | |
| 2006/0239317 | A1 | 10/2006 | Yoshida et al. | |
| 2006/0239621 | A1 * | 10/2006 | Lo et al. | 385/88 |

FOREIGN PATENT DOCUMENTS

| | | |
|---|---|---|
| JP | 2002-050824 A | 2/2002 |
| JP | 2005-164909 A | 6/2005 |
| JP | 2006-267236 A | 10/2006 |
| JP | 2006-301597 A | 11/2006 |
| JP | 2007-149932 A | 6/2007 |
| JP | 2007-334015 A | 12/2007 |

* cited by examiner

FIG.8

LASER MODULE AND METHOD FOR MANUFACTURING SAME

TECHNICAL FIELD

The present invention relates to a laser module and a method for manufacturing the same that are preferable to a laser module to input laser light outputted from a laser element to the core of an optical fiber.

BACKGROUND ART

For such a laser module, there are ones disclosed in Patent Literature 1 and Patent Literature 2 below, for example.

The laser modules of these patent literatures individually include a package, in which a heat sink is provided on a bottom plate in this package and a laser element is disposed on the heat sink. Moreover, a tubular pipe member is provided on the side plate of the package, and the tubular pipe member extends along the optical axis of laser light outputted from the laser element.

An optical fiber is inserted into the hollow portion of the pipe member. In the state in which the optical axis of the laser element is aligned with the optical axis of the optical fiber, the inner circumferential surface of the pipe member and the outer circumferential surface of the optical fiber are sealed with no gap using a sealing member, and the optical fiber is fixed to the hollow portion of the pipe member.

CITATION LIST

Patent Literature

[Patent Literature 1] JP-A-8-122578
[Patent Literature 2] JP-A-2002-50824

SUMMARY OF INVENTION

Objects to be Achieved by the Invention

Now, such an event sometimes occurs that a part of laser light emitted from the laser element is not optically coupled to the core of the optical fiber, propagated through a cladding as leak light, and absorbed into the pipe member and the sealing member through the cladding to generate heat in the pipe member and the sealing member. The heating value of the heat is increased in association with an increase in the output of the laser element in these years, and it is assumed that heat is generated above the heatproof temperature of the sealing member.

In the laser modules described in the patent literatures, the heat sink is provided right below the laser, but the pipe member is surrounded by air. Therefore, heat generated in the pipe member is conduced from the frame to the bottom plate along the axial direction of the pipe member, and reaches the heat sink. Namely, the heat dissipation path from the pipe member to the heat sink is increased more than the heat dissipation path of the laser element, and it is more difficult to dissipate heat to the pipe member than heat dissipation in the laser element.

Therefore, it is an object of the present invention to provide a laser module and a method for manufacturing the same that can improve heat dissipation characteristics.

Means for Achieving the Objects

In order to achieve the above object, a laser module according to the present invention includes: a bottom plate of a box; a frame member of the box including a through hole that communicates an internal space of the box with an external space, the frame member being fixed to the bottom plate; a pipe member including a hollow portion communicating with the through hole, the pipe member being joined to an outer wall of the frame member; an optical fiber held on the hollow portion of the pipe member; and a laser element accommodated in the internal space of the box, an optical axis of the laser element being aligned with an optical axis of the optical fiber, wherein when the bottom plate is placed on a plane, a bottom face of the pipe member is on a same face as a bottom plate portion contacting the plane.

In this laser module, since the entire bottom of the laser module is on almost the same face relative to the bottom face of the pipe member, in the case where the laser module is placed on the heat sink, the pipe member directly contacts the heat sink. Therefore, the heat dissipation path of heat generated in the pipe member due to leak light absorption is shortened, and the cross sectional area of the heat dissipation path is easily increased, so that it is possible to greatly suppress heat generation in the pipe member and the sealing member as compared with a structure in which the pipe member floats in the midair above the frame member like a cantilever. Accordingly, it is possible to improve the heat dissipation characteristics of the laser module.

Moreover, it is preferable that a relationship is provided in which a value that a contact area between the pipe member and the plane is divided by a base area of the pipe member is greater than a value that a contact area between the bottom plate and the plane is divided by a base area of the bottom plate.

In the case where this relationship is provided, it is possible to further improve heat dissipation to the pipe member even though the member itself has process distortion or the bottom plate is warped in the assembly of the package.

Moreover, it is preferable that a state is provided in which a height of the pipe member is lower than a height of the frame member to which the pipe member is joined.

In the case where this state is provided, when the top plate of the box is seam-welded to the top end of the frame member, it is possible to avoid the contact of the pipe member with a roller electrode for use in the seam welding.

Moreover, it is preferable that a state is provided in which a width of the pipe member is a value that a distance from a center of the hollow portion of the pipe member to the bottom face is doubled or more and smaller than a width of the frame member to which the pipe member is joined.

In the case where this state is provided, it is possible to maintain heat dissipation to the pipe member although it is intended to downsize the pipe member.

Moreover, a method for manufacturing a laser module according to the present invention includes: a pipe fixing process in which a pipe member is pressed against and fixed to a mounting stage to be a plane; and a joining process in which the pipe portion fixed to the mounting stage, a bottom plate of a box to accommodate a laser element, and a frame member of the box are joined to each other with a solder material in a predetermined order or simultaneously.

In this manufacturing method, in the case where the frame member is joined to the pipe member and then the bottom plate is joined, it is possible to join the bottom plate to the joined body of the pipe member to the frame member with no gap using the solder material, even though the bottom plate is warped or there is a dimensional tolerance. On one hand, in the case where the bottom plate is joined to the frame member and then joined to the pipe member, it is possible to join the pipe member to the joined body of the bottom plate to the frame member with no gap using the solder material, even though the bottom plate is warped or there is a dimensional tolerance. On the other hand, in the case where the bottom plate and the frame member are simultaneously joined to the pipe member, it is possible to join the pipe member, the bottom plate, and the frame member to each other with no gap using the solder material, even though the bottom plate is warped or there is a dimensional tolerance. As described above, even though the bottom plate is warped or there is a dimensional tolerance, it is possible to make the entire bottom of the laser module on almost the same face relative to the bottom face of the pipe member. Thus, in the case where the laser module is placed on the heat sink, the pipe member directly contacts the heat sink. Therefore, the heat dissipation path of heat generated in the pipe member due to leak light absorption is shortened, and the cross sectional area of the heat dissipation path is easily increased, so that it is possible to greatly suppress heat generation in the pipe member and the sealing member as compared with a structure in which the pipe member floats in the midair above the frame member like a cantilever. Accordingly, it is possible to improve the heat dissipation characteristics of the laser module.

Moreover, it is preferable that outer walls of the pipe portion fixed to the mounting stage and the frame member are joined to each other with a solder material, the bottom plate is placed on the mounting stage, and the placed bottom plate is joined to the frame member and the pipe member with a solder material whose melting point is lower than a melting point of the solder material used for joining the outer walls.

With this configuration, it is possible to prevent the solder material used for joining the frame member to the pipe member from melting in joining the bottom plate to the frame member and the pipe member. Thus, it is possible that the bottom plate is easily joined to the pipe member with no gap and the entire bottom of the laser module is on almost the same face relative to the bottom face of the pipe member, as compared with the case of using a solder material whose melting point is the melting point of the solder material used for joining the outer walls or more.

Moreover, it is preferable that the outer walls of the pipe portion and the frame member are joined to each other while pressing the frame member against the pipe portion fixed to the mounting stage, and the bottom plate is joined to the frame member and the pipe member while pressing a top end of the frame member.

With this configuration, it is possible to manufacture a laser module with reduced warpage on the bottom plate or the frame member. Thus, it is possible to increase the contact area of the bottom portion of the laser module in the case where the heat sink is placed, and it is possible to further improve the heat dissipation characteristics of the laser module.

Effect of Invention

As described above, according to the present invention, it is possible to provide a laser module and a method for manufacturing the same that can improve heat dissipation characteristics.

DESCRIPTION OF EMBODIMENTS

In the following, a preferable embodiment of a laser module according to the present invention will be described in detail with reference to the drawings.

Figure 1:
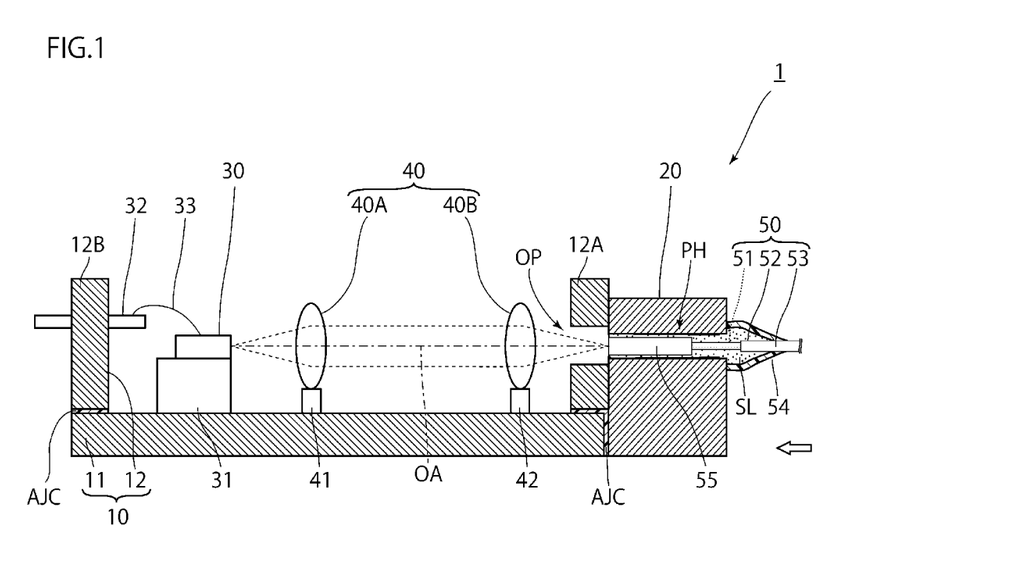
FIG. 1 is a schematic diagram of a laser module according to an embodiment of the present invention seen from the side.

As illustrated in FIG. 1, a laser module 1 according to an embodiment has main components including a box 10, a pipe member 20, a laser element 30, a lens 40, and an optical fiber 50.

The box 10 is a package including an internal space to accommodate the laser element 30, the lens 40, and the like. The box 10 according to the embodiment has a hollow, nearly rectangular parallelepiped shape, and includes a bottom plate 11 and a frame member 12.

The bottom plate 11 is formed of a single metal or ceramic plate, or a composite panel of a metal and ceramics. The metal material may be a single metallic element such as copper and molybdenum, for example, or may be an alloy formed of a plurality of metallic elements such as copper tungsten and copper molybdenum, or an alloy formed of a metallic element and a non-metallic element. On one hand, for ceramic materials, aluminum nitride or the like can be named, for example. On the other hand, for composite materials formed of a metal and ceramics, copper-aluminum nitride-copper or the like can be named, for example. It is noted that from the viewpoint that heat generated from the laser element 30 is released through a heat sink, for example, disposed on the bottom face side of the bottom plate 11, preferably, the bottom plate 11 includes a high thermal conductivity coefficient member whose thermal conductivity coefficient is above 100 W/mK.

The frame member 12 is a metal member or a ceramic member surrounding a space on the face on the opposite side of the bottom face of the bottom plate 11. The type of a metal or ceramics of the frame member 12 may be the same as the bottom plate 11 or may be different. The lower end of the frame member 12 is joined to the top face of the bottom plate 11 with a solder material (in the following, referred to as an adjustment solder material) AJC for adjusting a gap between the bottom plate 11 and the frame member 12. It is noted that from the viewpoint of reducing a warpage produced on the frame member 12 in joining the bottom plate 11, for the material of the frame member 12, one whose linear expansion coefficient is closer to the linear expansion coefficient of the bottom plate 11 is preferable.

The frame member 12 according to the embodiment is formed of a pair of walls in parallel with the longitudinal direction of the bottom plate 11 and a pair of walls in parallel with the width direction of the bottom plate 11, in which these walls surround the space on the face on the opposite side of the bottom face of the bottom plate 11. In the frame member 12, on a wall portion 12A to which the pipe member 20 is faced, a through hole OP that communicates the internal space of the box 10 with the external space is provided.

Figure 2:
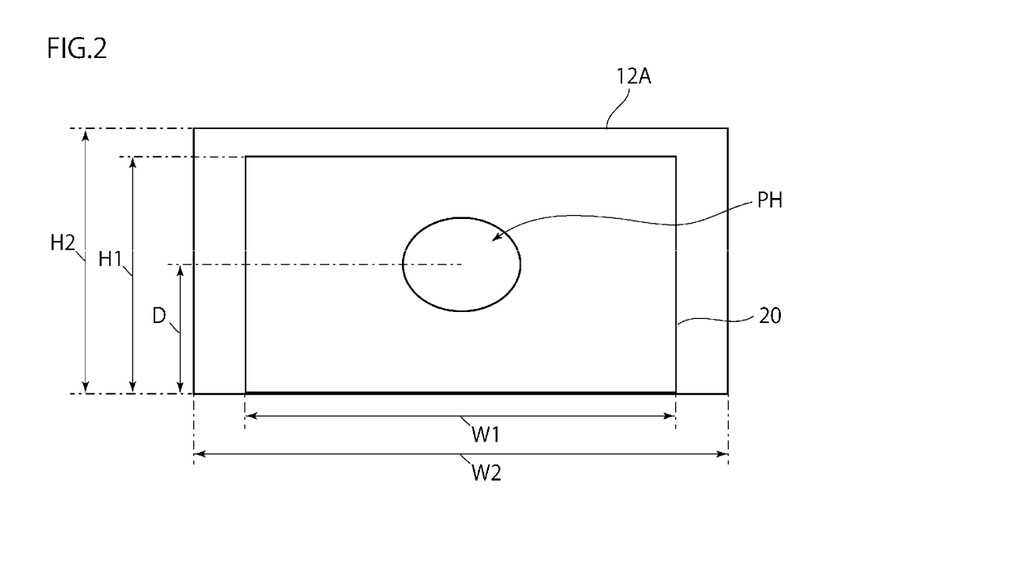
FIG. 2 is a schematic diagram of appearances of a frame member and a pipe member seen from an arrow direction in FIG. 1.

As illustrated in FIGS. 1 and 2, the pipe member 20 is a metal member or a ceramic member including a hollow portion PH. The type of this metal or ceramics may be the same or different from the bottom plate 11 or the frame member 12.

The pipe member 20 is joined to the outer wall of the wall portion 12A of the frame member 12 with a solder material (not shown) in the state in which the hollow portion PH of the pipe member 20 communicates with the through hole OP of the frame member 12. Moreover, the outer wall of the pipe member 20 is joined to the side surface of the bottom plate 11 with the adjustment solder material AJC. It is noted that from the viewpoint of reducing a warpage produced on the pipe member 20 in joining the bottom plate 11 to the frame member 12, for the material of the pipe member 20, one whose linear expansion coefficient is closer to the linear expansion coefficients of the bottom plate 11 and the frame member 12 is preferable. Furthermore, from the viewpoint of improving the heat dissipation characteristics of the pipe member 20, for the material of the pipe member 20, one having a higher thermal conductivity coefficient is preferable.

The pipe member 20 according to the embodiment has a nearly rectangular parallelepiped shape. As illustrated in FIG. 2, a height H1 of the pipe member 20 is lower than a height H2 of the wall portion 12A to which the pipe member 20 is joined. In addition, a width W1 of the pipe member 20 is a value that a distance D from the center of the hollow portion of the pipe member 20 to the bottom face is doubled or more and smaller than a width W2 of the wall portion 12A to which the pipe member 20 is joined.

The laser element 30 is an element that emits the laser light, which is disposed on a laser mounting portion 31 provided at a predetermined position on the inner surface of the bottom plate 11 as illustrated in FIG. 1. It is noted that for easy understanding, the shapes of the laser element 30 and the laser mounting portion 31 are simply illustrated in a rectangular parallelepiped in FIG. 1.

A lead pin 32 that penetrates through the frame member 12 is electrically connected to the laser element 30 through a wire 33. In the case of the embodiment, the lead pin 32 that penetrates through a wall portion 12B facing the wall portion 12A of the frame member 12 is adopted. It is noted that a power supply is connected to the lead pin 32, and a drive voltage is supplied from this power supply to the laser element 30 in turn through the lead pin 32 and the wire 33.

As illustrated in FIG. 1, the lens 40 is formed of a collimating lens 40A that collimates laser light emitted from the laser element 30 and a condenser lens 40B that condenses laser light collimated at the collimating lens 40A. It is noted that for easy understanding, the lenses 40A and 40B are not illustrated in the cross section.

The collimating lens 40A is disposed on a lens mounting portion 41 provided at a predetermined position between the laser element 30 and the wall portion 12A of the frame member 12, and the axis is aligned with an optical axis OA of laser light. The condenser lens 40B is disposed on a lens mounting portion 42 provided at a predetermined position on the rear side of the collimating lens 40A, and the axis is aligned with the optical axis OA of the laser light. It is noted that the shapes of the lens mounting portions 41 and 42 are simply illustrated as a rectangular parallelepiped. Moreover, the lens mounting portions 41 and 42 may be omitted. In the case where the lens mounting portions 41 and 42 are omitted, the collimating lens 40A and the condenser lens 40B are provided at predetermined positions on the face on the opposite side of the bottom face of the bottom plate 11.

As illustrated in FIG. 1, the optical fiber 50 includes a core 51, a cladding 52 that surrounds the outer circumferential surface of the core 51, and a buffer layer 53 that covers the outer circumferential surface of the cladding 52. At one end portion of the optical fiber 50, the buffer layer 53 is removed, and a part of the cladding 52 is exposed.

The exposed portion of the cladding 52 is inserted into the hollow portion PH of the pipe member 20, and the boundary portion between the exposed portion and the buffer layer 53 is disposed on the outer side of the other end which is on the opposite side of one end of the hollow portion PH facing the frame member 12. Moreover, a part of the optical fiber including the boundary portion is protected as covered by a boot 54.

In the case of the embodiment, a tubular ferrule 55 having the outer diameter almost the same as the inner diameter of the hollow portion PH is inserted into the hollow portion PH of the pipe member 20, and a part of the exposed portion of the cladding 52 is inserted into the inner hollow portion of the ferrule 55. It is noted that in the case of the embodiment, one end of the ferrule 55 and one end of the cladding 52, which is exposed, are positioned at the boundary between the frame member 12 and the pipe member 20. However, it is unnecessary to position these ends at the boundary as long as these ends are not exposed from the boundary.

The inner surface of the ferrule 55 is bonded to the outer surface of the cladding portion inserted into the inner hollow portion of the ferrule 55 with an adhesive. Furthermore, a sealing member SL such as an ultraviolet curable resin or a thermosetting resin is filled in the hollow portion PH of the pipe member 20 and the inner hollow portion of the boot 54, and the optical fiber 50 is fixed to the hollow portion PH of the pipe member 20 and the inner hollow portion of the boot 54 with the sealing member SL.

It is noted that the end portion at which the cladding 52 is exposed is directed to the emission portion of the laser element 30, in which the optical fiber 50 is optically coupled to the laser element 30 in such a way that laser light outputted from the laser element 30 is inputted to the core 51 (in the state in which the optical axes are aligned with each other).

Figure 3:
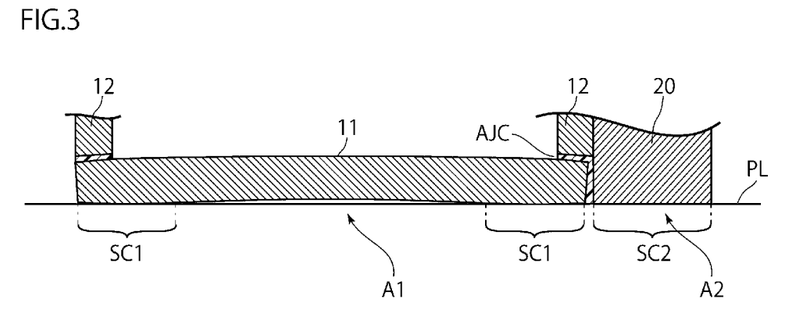
FIG. 3 is a schematic diagram illustrative of the bottom face of a bottom plate and the bottom face of the pipe member in a warped state.

In this laser module 1, the bottom face of the bottom plate 11 and the bottom face of the pipe member 20 are on almost the same face. It is noted that in the case where the bottom plate 11 is warped, the bottom face of the bottom plate 11 is a bottom plate portion SC1 contacting a plane PL when the bottom plate 11 is placed on the plane PL as illustrated in FIG. 3. In other words, at least the bottom plate portion SC1 is on the same face as the bottom face of the pipe member 20.

In the case of the embodiment, a relationship is provided in which a value that a contact area between the pipe member 20 and the plane PL is divided by a bottom face area A1 of the pipe member is greater than a value that a contact area between the bottom plate 11 and the plane PL is divided by a bottom face area A2 of the bottom plate 11. It is noted that the contact area between the pipe member 20 and the plane PL is the area of a pipe portion SC2 contacting the plane PL in FIG. 3, and the contact area between the bottom plate 11 and the plane PL is the area of the bottom plate portion SC1 contacting the plane PL in FIG. 3.

In the case where laser light is emitted from the laser element 30, the laser module 1 in the configuration above is placed on the heat sink surface of the heat sink in the state in which a top plate is mounted on the top end of the frame member 12 to cover the internal space of the box 10.

Laser light emitted from the laser element 30 enters the core 51 at the tip end of the optical fiber fixed to the hollow portion PH of the pipe member 20 in turn through the collimating lens 40A and the condenser lens 40B, and propagates through the core 51.

On the other hand, in the case where a part of laser light is not optically coupled to the core 51 and is incident to the cladding 52 as leak light, the laser light is absorbed into the pipe member 20 and the sealing member SL through the cladding 52 to cause the pipe member 20 and the sealing member SL to generate heat.

In regard to this point, in the laser module 1 according to the embodiment, in the case where the bottom plate 11 is placed on the plane PL (FIG. 3), the bottom plate portion contacting the plane PL is on the same face as the bottom face of the pipe member 20. Namely, the overall bottom of the laser module 1 is on almost the same face relative to the bottom face of the pipe member 20. Thus, in the case where the laser module 1 is placed on the heat sink, the pipe member 20 directly contacts the heat sink.

Therefore, in the laser module 1 according to the embodiment, the heat dissipation path of heat generated in the pipe member 20 is shortened by absorbing leak light, and the cross sectional area of the heat dissipation path is easily increased, so that it is possible to greatly suppress heat generation in the pipe member 20 and the sealing member SL as compared with a structure in which the pipe member floats in the midair above the frame member like a cantilever. Accordingly, it is possible to improve the heat dissipation characteristics of the laser module 1.

Moreover, in the case of the embodiment, as illustrated in FIG. 3, the relationship is provided in which the value that the contact area between the pipe member 20 and the plane PL is divided by the bottom face area A1 of the pipe member is greater than the value that the contact area between the bottom plate 11 and the plane PL is divided by the bottom face area A2 of the bottom plate 11.

In the laser module 1 according to the embodiment in this relationship, even though the bottom plate 11 itself has process distortion or the bottom plate 11 is warped in the assembly of the package, it is possible to further improve heat dissipation to the pipe member 20. Moreover, even though the surface area of the bottom face of the pipe member 20 is smaller than the surface area of the bottom plate 11, it is possible to further improve heat dissipation to the pipe member 20.

Furthermore, in the laser module 1 according to the embodiment, as illustrated in FIG. 2, the height H1 of the pipe member 20 is lower than the height H2 of the frame member 12 (the wall portion 12A) to which the pipe member 20 is joined.

In the case where this state is provided, when the top plate is seam-welded to the top end of the frame member 12, it is possible to avoid the contact of the pipe member 20 with a roller electrode for use in the seam welding.

In addition, in the laser module 1 according to the embodiment, as illustrated in FIG. 2, the width W1 of the pipe member 20 is the value that the distance D from the center of the hollow portion of the pipe member 20 to the bottom face is doubled or more and smaller than the width W2 of the wall portion 12A to which the pipe member 20 is joined.

Heat generated in the pipe member 20 tends to spread concentrically from the center of the hollow portion of the pipe member 20. Thus, in the case where the width W1 of the pipe member 20 is smaller than the value that the distance D from the center of the hollow portion of the pipe member 20 to the bottom face is doubled, a confinement phenomenon can occur such as the slowing down of the heat spread in the crosswise direction of the pipe member 20. Therefore, in the case where the width W1 of the pipe member 20 is the value that the distance D from the center of the hollow portion of the pipe member 20 to the bottom face is doubled or more, it is possible to improve the heat dissipation characteristics of the pipe member 20 as compared with the case where the width W1 of the pipe member 20 is less than the value. Moreover, in the case where the width W1 of the pipe member 20 is smaller than the width W2 of the wall portion 12A to which the pipe member 20 is joined, it is possible to downsize the pipe member 20 itself as compared with the case where the width W1 of the pipe member 20 is greater than the width W2. As described above, in the case where the width W1 of the pipe member 20 is the value that the distance D from the center of the hollow portion of the pipe member 20 to the bottom face is doubled or more and smaller than the width W2 of the wall portion 12A, it is possible to make the heat dissipation characteristics of the pipe member 20 excellent although it is intended to downsize the pipe member 20.

Figure 4:
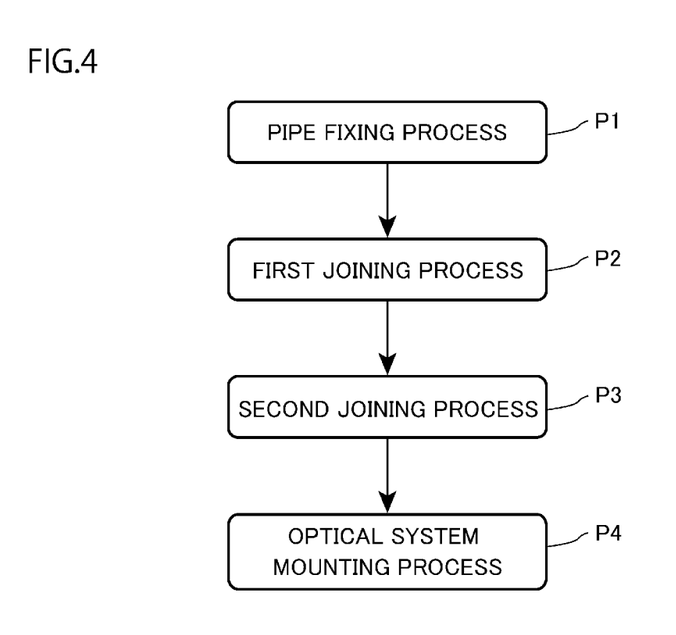
FIG. 4 is a flowchart of main processes of a method for manufacturing the laser module.

Next, a method for manufacturing the laser module 1 will be described. As illustrated in FIG. 4, the method for manufacturing the laser module 1 mainly includes a pipe fixing process P1, a first joining process P2, a second joining process P3, and an optical system mounting process P4.

Figure 5A:
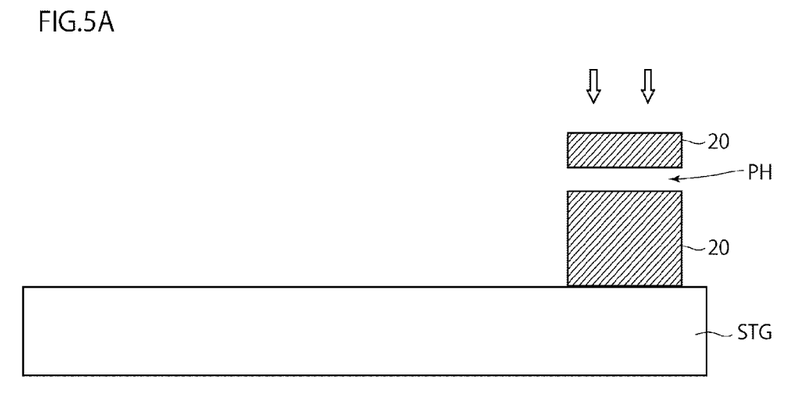
FIGS. 5A to 5C are diagrams of Manner (1) of the laser module under manufacture.

As illustrated in FIG. 5A, the pipe fixing process P1 is a process in which the pipe member 20 is pressed against a mounting stage STG in the state in which the bottom face of the pipe member 20 faces the mounting surface of the mounting stage STG to be a plane.

Figure 5B:
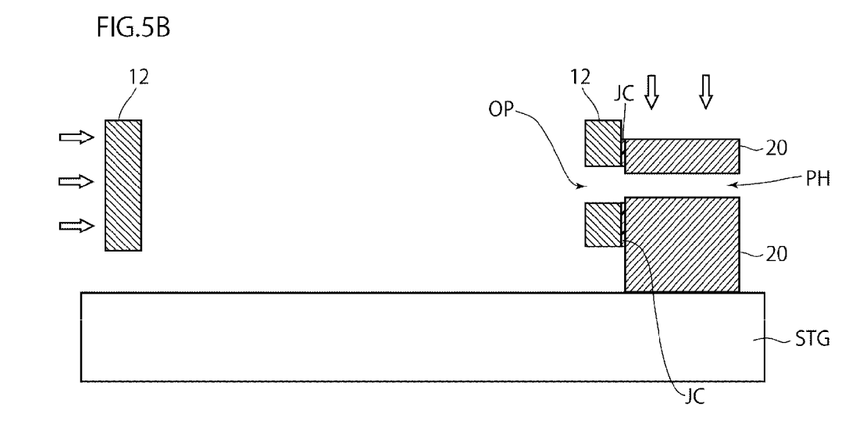

As illustrated in FIG. 5B, the first joining process P2 is a process in which the outer walls of the frame member 12 and the pipe member 20 are joined to each other in the state in which the through hole OP provided on the frame member 12 communicates with the hollow portion PH bored on the pipe member 20.

More specifically, first, the frame member 12 is disposed in the state in which the center axis of the through hole OP on the frame member 12 is on the center axis of the hollow portion PH on the pipe member 20. Subsequently, as this state is kept, the outer wall of the frame member 12 is pressed against the outer wall of the pipe member 20 through a solder material JC to join the outer walls to each other. For the material of the solder material, silver solder or gold tin solder, for example, is named.

In the joining, since the frame member 12 is pressed against the pipe member 20 in the fixed state, the frame member 12 is joined to the pipe member 20 in the state in which the side surface of the pipe member 20 is nearly in parallel with the frame member 12 even though the frame member 12 is warped.

Figure 5C:
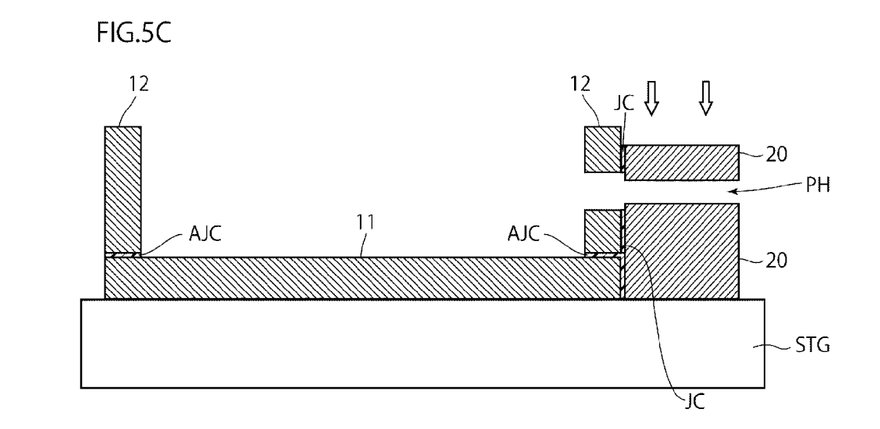

As illustrated in FIG. 5C, the second joining process P3 is a process in which the side surface of the bottom plate 11 placed on the mounting surface of the mounting stage STG is joined to the inner wall of the frame member 12 with no gap using the adjustment solder material AJC.

More specifically, after the bottom plate 11 is placed on the mounting surface of the mounting stage STG, the side surface of the bottom plate 11 is joined to the outer wall of the pipe member 20 and the top face of the bottom plate 11 is joined to the lower end of the frame member 12 with no gap using the adjustment solder material AJC.

The adjustment solder material AJC may be the same solder material as the solder material JC used for joining the pipe member 20 to the frame member 12. However, from the viewpoint of preventing the solder material JC from melting in the second joining process, preferably, the adjustment solder material AJC is one whose melting point is lower than the melting point of the solder material JC. More specifically, in the case where the solder material JC is silver solder, gold tin solder, for example, is named.

Moreover, in the case of using the adjustment solder material AJC whose melting point is lower than the melting point of the solder material JC, preferably, the bottom plate 11 is joined to the frame member 12 and the pipe member 20 while pressing the top end of the frame member 12 against the mounting stage STG. When the components are joined to each other in this manner, even though the bottom plate 11 is warped, the bottom plate 11 can be joined to the frame member 12 and the pipe member 20 in the state in which the warpage is suppressed.

As in turn processed through the pipe fixing process P1, the first joining process P2, and the second joining process P3, after the frame member 12 is joined in the state in which the pipe member 20 is pressed, the bottom plate 11 can be joined to the pipe member 20 and the frame member 12 with no gap using the adjustment solder material AJC.

Therefore, in the joined body of the pipe member 20 to the box 10 (the joined body of the bottom plate 11 to the frame member 12), the entire bottom can be placed on almost the same face relative to the bottom face of the pipe member, even though the bottom plate is warped or there is a dimensional tolerance. Thus, in the case where the joined body is placed on the heat sink, the pipe member 20 directly contacts the heat sink. Therefore, the heat dissipation path of heat generated in the pipe member 20 is shortened by absorbing leak light, and the cross sectional area of the heat dissipation path is easily increased, so that it is possible to greatly suppress heat generation in the pipe member 20 as compared with the structure in which the pipe member 20 floats in the midair above the frame member like a cantilever.

The optical system mounting process P4 is a process in which the laser element 30, the lens 40, and the optical fiber 50 are mounted at predetermined positions on the joined body of the pipe member 20 to the box 10.

Figure 6A:
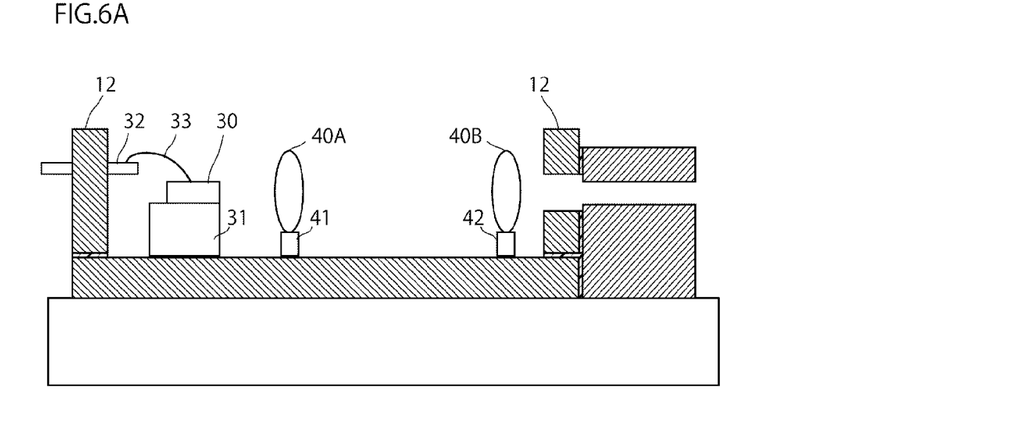
FIGS. 6A to 6C are diagrams of Manner (2) of the laser module under manufacture.

More specifically, as illustrated in FIG. 6A, in the first step, the laser mounting portion 31 is fixed at a predetermined position on the top face of the bottom plate 11 of the box 10, and then the laser element 30 is fixed on the laser mounting portion 31. The lead pin 32 is then mounted at a predetermined position on the frame member 12, and the lead pin 32 is electrically connected to the laser element 30 with the wire 33.

Moreover, after the lens mounting portions 41 and 42 are fixed at predetermined positions on the top face of the bottom plate 11 of the box 10, the collimating lens 40A is disposed on the lens mounting portion 41, and the condenser lens 40B is disposed on the lens mounting portion 42.

Figure 6B:
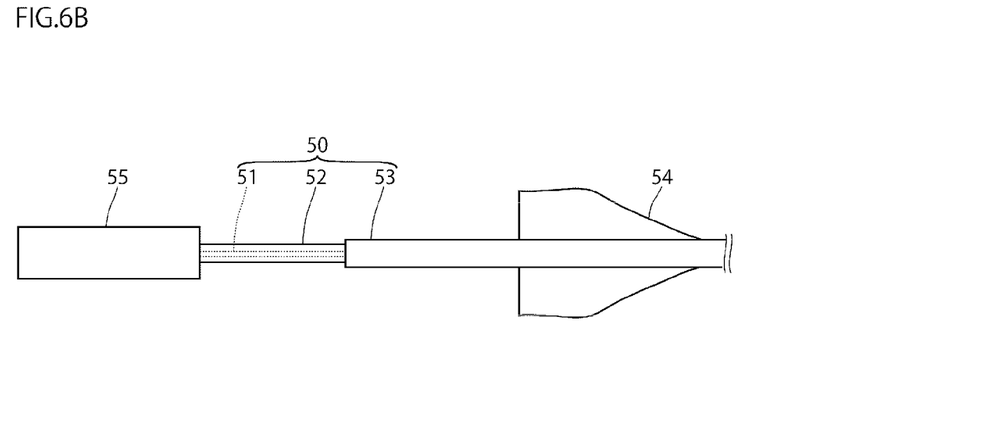

As illustrated in FIG. 6B, in the second step, the optical fiber to be fixed to the pipe member 20 is prepared. More specifically, the boot 54 is inserted into the optical fiber 50. Furthermore, the cladding 52 is exposed from the buffer layer 53 on one end side of the optical fiber 50. In addition, the tip end portion of the cladding 52 is fixed to the inner hollow portion of the ferrule 55 in the state in which the tip end of the cladding 52 is matched with one end of the ferrule 55. For the fixing, an adhesive, for example, is used. It is noted that the second step may be performed prior to the processes P1 to P3 or the pipe fixing process P1 other than the optical system mounting process P4.

Figure 6C:
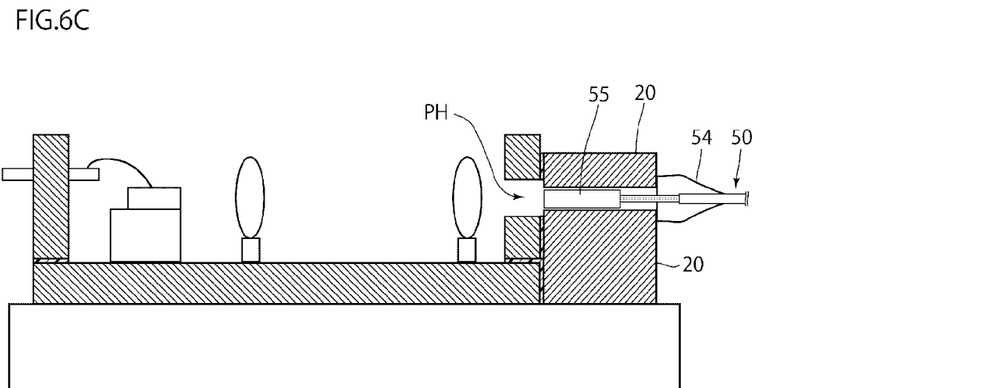

As illustrated in FIG. 6C, in the third step, the ferrule 55 to which the tip end portion of the cladding 52 is fixed is inserted into the hollow portion PH of the pipe member 20 until one end of the ferrule 55 is positioned on the boundary between the pipe member 20 and the frame member 12.

In the fourth step, the positions at which the collimating lens 40A, the condenser lens 40B, and the optical fiber 50 are disposed are finely adjusted to align the optical axes of the collimating lens 40A, the condenser lens 40B, and the optical fiber 50 with the optical axis OA (FIG. 1) of laser light emitted from the laser element 30.

In the fifth step, the collimating lens 40A and the condenser lens 40B are fixed to the corresponding lens mounting portions 41 and 41B with an adhesive, for example. Moreover, as illustrated in FIG. 1, the optical fiber 50 is fixed to the hollow portion PH of the pipe member 20 and the inner hollow portion of the boot 54 with the sealing member SL.

For a specific method for fixing the optical fiber 50, such a method can be named, in which for example, a hole is bored on the boot 54, an uncured thermosetting resin is filled into the hole, and then heat is applied, or an ultraviolet curable resin is filled, and then ultraviolet rays are applied.

As in turn processed through the first step to the fifth step, the laser module 1 as illustrated in FIG. 1 is manufactured. The laser module 1 is actually used in the state in which the top plate is mounted on the box 10 and the laser module 1 is placed on the heat sink surface of the heat sink.

It is noted that the order of the first step to the fifth step described as the optical system mounting process P4 are merely examples, and the laser element 30, the lens 40, and the optical fiber 50 may be mounted at predetermined positions on the joined body of the pipe member 20 to the box 10 in the order different from this order.

As described above, the present invention is described as the foregoing embodiment is taken as an example. However, the present invention is not limited thereto.

For example, in the foregoing embodiment, a hollow rectangular parallelepiped shape is adapted as the shape of the box 10. However, the shape may be a hollow cylindrical shape, and various shapes may be adapted other than these shapes.

Figure 7:
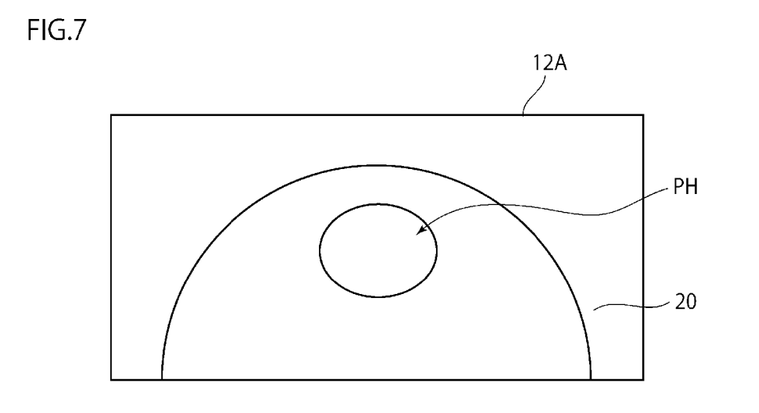
FIG. 7 is a schematic diagram of a pipe member in a shape different from the embodiment seen from the same viewpoint in FIG. 2.

Moreover, in the foregoing embodiment, a member whose cross section is in a rectangle is adapted as the pipe member 20. However, a member whose cross section is in a semicircle may be fine as illustrated in FIG. 7, for example, and members in cross sections other than these cross sections may be adapted.

Furthermore, in the foregoing embodiment, the ferrule 55 is inserted into the hollow portion PH of the pipe member 20. However, the ferrule 55 may be omitted. In the case where the ferrule 55 is omitted, the outer circumferential surface of the exposed cladding 52 is fixed to the inner circumferential surface of the hollow portion PH with the sealing member SL.

Figure 8:
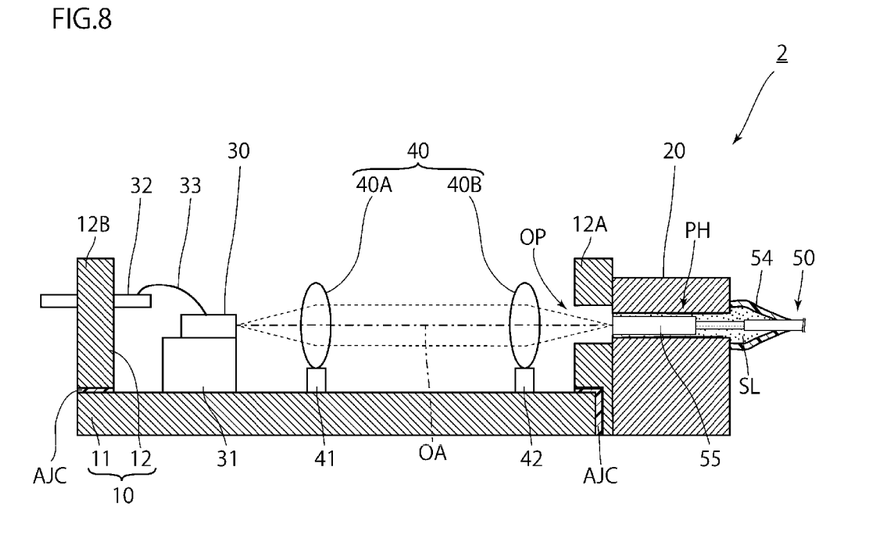
FIG. 8 is a schematic diagram of a laser module seen from the side according to another embodiment.

In addition, in the foregoing embodiment, the laser module 1 is adapted in which the top face of the bottom plate 11 is joined to the under face of the frame member 12 and the side surface of the bottom plate 11 is joined to the outer wall of the pipe member 20 with the adjustment solder material AJC. However, as illustrated in FIG. 8, a laser module 2 may be adapted in which a notch is provided on the lower end of the frame member 12 and the notch portion is joined to the top face and side surface of the bottom plate 11 with the adjustment solder material AJC.

Moreover, in the foregoing embodiment, the collimating lens 40A and the condenser lens 40B are disposed on the internal space of the box 10. However, the lenses 40A and 40B may be omitted. It is noted that in the case where the lenses 40A and 40B are provided, it is possible that a plurality of the laser elements 30 is provided on the front side of the lens 40A in the internal space of the box 10 and laser light emitted from the laser elements 30 is caused to enter the optical fiber 50. Therefore, from the viewpoint of causing laser light emitted from a plurality of the laser elements 30 to enter the optical fiber 50, preferably, the lenses 40A and 40B are not omitted. On the other hand, in the case where the lenses 40A and 40B are omitted, such a form may be adapted in which a fiber mounting portion is provided on the internal space of the box 10 and an exposed end is disposed on the mounting portion. Therefore, from the viewpoint of downsizing the box 10, preferably, the lenses 40A and 40B are omitted.

Furthermore, in the forgoing manufacturing method, the frame member 12 is joined to the pipe member 20, and then the bottom plate 11 is joined. However, it may be fine that the bottom plate 11 is joined to the frame member 12 and then the frame member 12 is joined to the pipe member 20. In the case of joining the components in this manner, it may be fine that the bottom plate 11 is joined to the frame member 12 using the solder material JC in the first joining process P2 and the joined body of the bottom plate 11 to the frame member 12 is fixed to the pipe member 20 which is fixed to the mounting stage STG using the adjustment solder material AJC in the second joining process P3. However, the first joining process P2 in this case may be performed prior to the pipe fixing process P1. As described above, even though the bottom plate 11 is joined to the frame member 12 and then the frame member 12 is joined to the pipe member 20, the bottom plate 11 and the frame member 12 can be joined to the pipe member 20 with no gap using the adjustment solder material AJC similarly to the foregoing manufacturing method.

It is noted that it may be possible to simultaneously join the pipe member 20 fixed to the mounting stage STG, the bottom plate 11, and the frame member 12 to each other. In the case of joining the components in this manner, it may be fine that the first joining process P2 is omitted and the bottom plate 11 and the frame member 12 are joined to the pipe member 20 which is fixed to the mounting stage STG using the adjustment solder material AJC in the second joining process P3. Also with this configuration, the bottom plate 11 and the frame member 12 can be joined to the pipe member 20 with no gap using the adjustment solder material AJC similarly to the foregoing manufacturing method.

INDUSTRIAL APPLICABILITY

The present invention is applicable in the fields that handle laser light outputted from a laser element.

REFERENCE SIGNS LIST 1, 2 . . . laser module
10 . . . box
11 . . . bottom plate
12 . . . frame member
20 . . . pipe member
30 . . . laser element
31 . . . laser mounting portion
32 . . . lead pin
33 . . . wire
40A . . . collimating lens
40B . . . condenser lens
41, 42 . . . lens mounting portion
50 . . . optical fiber
51 . . . core
52 . . . cladding
53 . . . buffer layer
54 . . . boot
55 . . . ferrule
OP . . . through hole
PH . . . hollow portion
SL . . . sealing member
SC1 . . . bottom plate portion
SC2 . . . pipe portion
STG . . . mounting stage
AJC . . . adjustment solder material
JC . . . solder material
P1 . . . pipe fixing process
P2 . . . first joining process
P3 . . . second joining process
P4 . . . optical system mounting process

The invention claimed is:

1. A laser module comprising:
a bottom plate of a box;
a frame member of the box including a through hole that communicates an internal space of the box with an external space, the frame member being fixed to the bottom plate;
a pipe member including a hollow portion communicating with the through hole, the pipe member being joined to an outer side surface of the frame member;
an optical fiber held on the hollow portion of the pipe member; and
a laser element accommodated in the internal space of the box, an optical axis of the laser element being aligned with an optical axis of the optical fiber,
wherein the hollow portion of the pipe member extending in a thickness direction of the pipe member, the thickness direction extending along an axial direction of the pipe member, and the pipe member includes a bottom face extending through entire thickness of the pipe member, and
wherein when the bottom plate is placed on a plane, an entirety of the bottom face of the pipe member is a portion of the pipe member positioned on a same face as a portion of the bottom plate contacting the plane.

2. The laser module according to claim 1, wherein a following relationship is satisfied:

$CA_1/ABP_1$ is greater than $CA_2/ABP_2$ wherein the $CA_1$ is a contact area between the pipe member and the plane, the $ABP_1$ is an area of the bottom face of the pipe member, the $CA_2$ is a contact area between the bottom plate and the plane, and the $ABP_2$ is an area of the bottom plate.

3. The laser module according to claim 1, wherein a state is provided in which a height of the pipe member is lower than a height of the frame member to which the pipe member is joined.

4. The laser module according to claim 1, wherein a width of the pipe member is smaller than a width of the frame member to which the pipe member is joined and the width of the pipe member is more than twice as long as a distance from a center of the hollow portion of the pipe member to the bottom face.

5. The laser module according to claim 1, wherein the pipe member is made of metal or ceramic.

6. A method for manufacturing a laser module comprising:
a pipe fixing process in which a pipe member is disposed on a flat surface of a mounting stage and pressed against and fixed to the flat surface of the mounting stage; and
after the pipe fixing process, a joining process in which a bottom plate of a box to accommodate a laser element disposed on the flat surface of the mounting stage, and a frame member of the box are joined to the pipe member fixed to the mounting stage with a solder material in a predetermined order or simultaneously, wherein outer walls of the pipe member fixed to the mounting stage and the frame member are joined to each other with a solder material, the bottom plate is placed on the mounting stage, and the placed bottom plate is joined to the frame member and the pipe member with a solder material whose melting point is lower than a melting point of the solder material used for joining the outer walls, and wherein the outer walls of the pipe member and the frame member are joined to each other while pressing the frame member against the pipe member fixed to the mounting stage, and the bottom plate is joined to the frame member and the pipe member while pressing a top end of the frame member.

\* \* \* \* \*